US011211119B1

(12) United States Patent
Gorobets et al.

(10) Patent No.: US 11,211,119 B1
(45) Date of Patent: Dec. 28, 2021

(54) QLC PROGRAMMING METHOD WITH STAGING OF FINE DATA

(71) Applicant: Western Digital Technologies, Inc., San Jose, CA (US)

(72) Inventors: Sergey Anatolievich Gorobets, Edinburgh (GB); Alan D. Bennett, Edinburgh (GB); Thomas Hugh Shippey, Edinburgh (GB); Ryan R. Jones, Mesa, AZ (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/899,374

(22) Filed: Jun. 11, 2020

(51) Int. Cl.
| G11C 16/04 | (2006.01) |
| G11C 11/56 | (2006.01) |
| G11C 16/26 | (2006.01) |
| G11C 16/10 | (2006.01) |

(52) U.S. Cl.
CPC ............ *G11C 11/56* (2013.01); *G11C 16/10* (2013.01); *G11C 16/26* (2013.01); *G11C 16/0483* (2013.01)

(58) Field of Classification Search
CPC ......... G11C 11/56; G11C 16/10; G11C 16/26; G11C 16/0483
See application file for complete search history.

(56) References Cited

U.S. PATENT DOCUMENTS

| 8,499,215 B2 | 7/2013 | Kong et al. |
| 8,775,901 B2 | 7/2014 | Sharon et al. |
| 8,898,374 B2 * | 11/2014 | Yang ............... G06F 12/0246 711/103 |
| 9,135,155 B2 * | 9/2015 | Sharon ............. G06F 12/14 |
| 9,619,321 B1 | 4/2017 | Haratsch et al. |
| 10,025,662 B2 | 7/2018 | Yang et al. |
| 10,101,942 B1 | 10/2018 | Parker et al. |
| 10,204,007 B2 * | 2/2019 | Zhang ............. G06F 11/1048 |
| 10,339,000 B2 | 7/2019 | Yang et al. |
| 10,769,014 B2 | 9/2020 | Cariello |
| 10,789,126 B2 | 9/2020 | Singidi et al. |

(Continued)

FOREIGN PATENT DOCUMENTS

| EP | 2513907 A1 | 10/2012 |
| WO | 2011075597 A1 | 6/2011 |
| WO | 2017087059 A2 | 5/2017 |

OTHER PUBLICATIONS

Cai et al. "Error characterization, Mitigation, and Recovery in Flash-Memory-Based Solid-State Drives," Proceedings of the IEEE, vol. 105, No. 9, pp. 1666-1704, Sep. 2017, doi: 10.1109/JPROC.2017.2713127, <https://arxiv.org/pdf/1706.08642.pdf>.

(Continued)

*Primary Examiner* — Pho M Luu (74) *Attorney, Agent, or Firm* — Patterson & Sheridan, LLP; Steven H. Versteeg (57) ABSTRACT

Data can be written to SLC memory. Then, the data can be decoded and then both foggy and finely written to MLC. After the decoding, the data can be stored in DRAM located in a front end or in a SRAM located in a flash manager prior to being written to MLC. After storing in either the DRAM or SRAM, the data is then decoded and written to MLC.

20 Claims, 10 Drawing Sheets

(56) References Cited

U.S. PATENT DOCUMENTS

2018/0025776 A1    1/2018   Achtenberg et al.
2020/0194064 A1    6/2020   Barndt et al.

OTHER PUBLICATIONS

International Search Report and the Written Opinion for International Application No. PCT/US2020/066420 dated Apr. 7, 2021, 11 pages.
Benoit et al. "Efficient Checkpoint/Verification Patterns for Silent Error Detection," ICL Research Report, RR-1403, May 2014, 16 pages.

\* cited by examiner

| WL | STAGE | STR0 | STR1 | STR2 | STR3 |
|---|---|---|---|---|---|
| 127 | FINE | 1020 | 1021 | 1022 | 1023 |
| | FOGGY | 1012 | 1014 | 1016 | 1018 |
| 126 | FINE | 1013 | 1015 | 1017 | 1019 |
| | FOGGY | 1004 | 1006 | 1008 | 1010 |
| ⋮ | | | | | |
| 3 | FINE | 29 | 31 | 33 | 35 |
| | FOGGY | 20 | 22 | 24 | 26 |
| 2 | FINE | 21 | 23 | 25 | 27 |
| | FOGGY | 12 | 14 | 16 | 18 |
| 1 | FINE | 13 | 15 | 17 | 19 |
| | FOGGY | 4 | 6 | 8 | 10 |
| 0 | FINE | 5 | 7 | 9 | 11 |
| | FOGGY | 0 | 1 | 2 | 3 |

QLC PROGRAMMING METHOD WITH STAGING OF FINE DATA

BACKGROUND OF THE DISCLOSURE

Field of the Disclosure

Embodiments of the present disclosure generally relate to improving foggy-fine writing to QLC.

Description of the Related Art

Programming or writing data may require two writing phases: foggy and fine. In foggy-fine programming, the bits to be written cannot simply be written once. Rather, the data needs to be first written by foggy programming where voltage pulses are provided to push the current state to a more resolved state, but not completely resolved state. Fine programming is performed at a point in time after foggy programming to write the data again in the completely resolved state.

In foggy-fine programming, there is a four page transfer for foggy programming and a four page transfer for fine programming for a 128 KB transfer in total for a two-plane device. The foggy state is unreadable, and the data needs to be protected in case of a possible power loss event (PLI). Additionally, foggy-fine programming occurs in a staggered word line sequence, which means that data in transit is five times or eight times the programmable unit of 128 KB. To perform foggy-fine programming, multiple megabytes may be programmed multiple times. To perform the multiple programming, a large amount of data needs to be set aside in order to perform repeat programming with the exact same data.

Therefore, there is a need in the art for improved foggy-fine programming.

SUMMARY OF THE DISCLOSURE

The present disclosure generally relates to improved foggy-fine programming. The data can be written to SLC memory. Then, the data can be decoded and then both foggy and finely written to MLC. After the decoding, the data can be stored in DRAM located in a front end or in a SRAM located in a flash manager prior to being written to MLC. After storing in either the DRAM or SRAM, the data is then decoded and written to MLC.

In one embodiment, a data storage device comprises: one or more memory devices, the one or more memory devices including SLC memory and MLC memory; and a controller coupled to the one or more memory devices, the controller configured to: write data to the SLC memory; foggy write the data to MLC memory, wherein the foggy writing the data to the MLC memory includes: retrieving the data from latches in the one or more memory devices; decoding the data retrieved from the latches; encoding the decoded data retrieved from the latches; and writing the encoded data to the MLC memory; and fine writing the data to the MLC memory.

In another embodiment, a data storage device comprises: one or more memory devices, the one or more memory devices each including a plurality of dies with each die including SLC memory and MLC memory; and a controller coupled to the one or more memory devices, the controller configured to: write data to SLC memory; read data from SLC memory; decode the read data; transfer the decoded data to DRAM; encode the transfer data a first time; and write the first time encoded data to MLC memory a first time.

In another embodiment, a data storage device comprises: one or more memory devices, wherein each memory device has a plurality of dies, wherein the one or more memory devices each include SLC memory and MLC memory; a controller coupled to the one or more memory devices, the controller configured to: write data to the SLC memory; read the data from the SLC memory; decode the read data; deliver the decoded data to a first SRAM located in a front end module; deliver the decoded data to a second SRAM located in a flash manager; write data delivered to the first SRAM in the MLC memory; and write data delivered to the second SRAM in the MLC memory.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to improved foggy-fine programming. The data can be written to SLC memory. Then, the data can be decoded and then both foggy and finely written to MLC. After the decoding, the data can be stored in DRAM located in a front end or in a SRAM located in a flash manager prior to being written to MLC. After storing in either the DRAM or SRAM, the data is then decoded and written to MLC.

Figure 1:
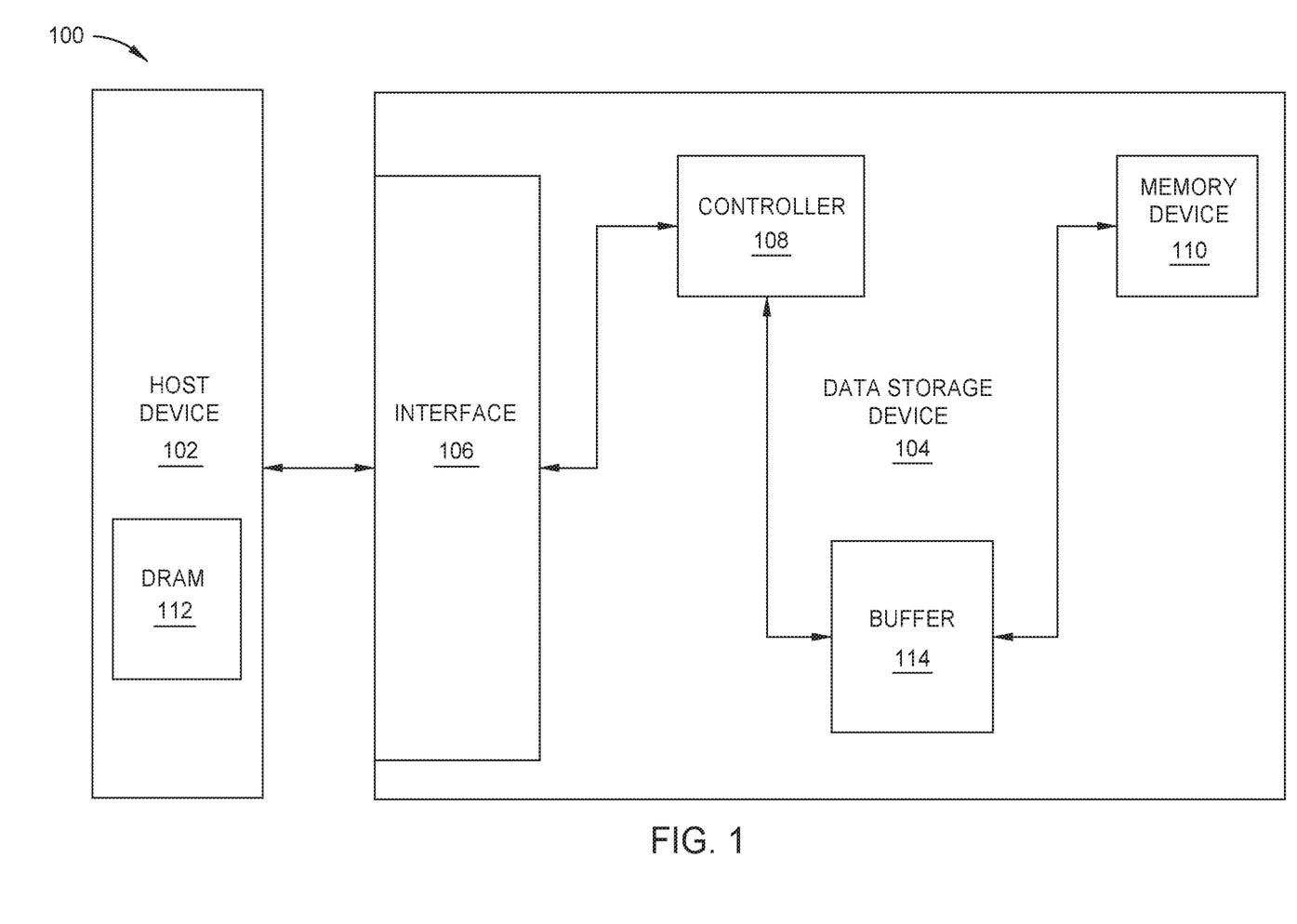
FIG. 1 is a schematic illustration of a system for storing data according to one embodiment.

FIG. 1 is a schematic illustration of a system 100 for storing data according to one embodiment. The system 100 for storing data according to one embodiment includes a host device 102 and a data storage device 104. The host device 102 includes a dynamic random-access memory (DRAM) 112. The host device 102 may include a wide range of devices, such as computer servers, network attached storage (NAS) units, desktop computers, notebook (i.e., laptop) computers, tablet computers (i.e., "smart" pad), set-top boxes, telephone handsets (i.e., "smart" phones), televisions, cameras, display devices, digital media players, video gaming consoles, video streaming devices, and automotive applications (i.e., mapping, autonomous driving). In certain embodiments, host device 102 includes any device having a processing unit or any form of hardware capable of processing data, including a general purpose processing unit, dedicated hardware (such as an application specific integrated circuit (ASIC)), configurable hardware such as a field programmable gate array (FPGA), or any other form of processing unit configured by software instructions, microcode, or firmware.

The data storage device 104 communicates with the host device 102 through an interface 106 included in the data storage device 104. The data storage device 104 includes a controller 108, a buffer 114, and one or more memory devices 110. The data storage device 104 may be an internal storage drive, such as a notebook hard drive or a desktop hard drive. Data storage device 104 may be a removable mass storage device, such as, but not limited to, a handheld, removable memory device, such as a memory card (e.g., a secure digital (SD) card, a micro secure digital (micro-SD) card, or a multimedia card (MMC)) or a universal serial bus (USB) device. Data storage device 104 may take the form of an embedded mass storage device, such as an eSD/eMMC embedded flash drive, embedded in host device 102. Data storage device 104 may also be any other type of internal storage device, removable storage device, embedded storage device, external storage device, or network storage device.

Memory device 110 may be, but is not limited to, internal or external storage units. The memory device 110 relies on a semiconductor memory chip, in which data can be stored as random-access memory (RAM), read-only memory (ROM), or other forms for RAM and ROM. RAM is utilized for temporary storage of data whereas ROM is utilized for storing data permanently.

Data storage device 104 includes a controller 108 which manages operations of data storage device 104, such as writes to or reads from memory device 110. The controller 108 executes computer-readable program code (e.g., software or firmware) executable instructions (herein referred to as "instructions") for the transfer of data. The instructions may be executed by various components of controller 108 such as processor, logic gates, switches, applications specific integrated circuits (ASICs), programmable logic controllers embedded microcontrollers, and other components of controller 108.

Data storage device 104 includes a buffer 114 which is a region of physical memory storage used to temporarily store data while the data is being moved from one place to another (i.e., from host device 102 to memory device 110).

Data may be transferred to or from the DRAM 112 of the host device 102 to the data storage device 104. One data transfer pathway may originate from the DRAM 112 of the host device 102 and communicate through the interface 106 of the data storage device 104 to the controller 108. The data will then pass through the buffer 114 of the data storage device 104 and be stored in the memory device 110. If the data is written to a SLC memory, then the data is simply written. If, however, the data is written to a MLC, such as a QLC memory, then a foggy-fine writing process occurs. It is to be noted that writing and programming may be used interchangeably throughout the disclosure. In one embodiment, the data is first written to SLC memory and then moved to MLC memory. In another embodiment, all data is written to SLC cache first and then moved to QLC for sequential or non-repetitive writes. In such a scenario, the moving of the data to QLC is scheduled by the data storage device 204 as to create free space in SLC for the following writes from the host device 102. In another embodiment, repetitive write comprises the host rewriting recently written LBAs where recently means the data is still in SLC cache. In such a scenario, three possibilities exist: move all the data, including the old obsolete LBAs to QLC and create obsolete 'holes"; move valid data only, skipping obsolete data in SLC; and if the amount of obsolete data is high, then compact SLC cache, do a garbage collection, without moving any data to QLC.

Figure 2A:
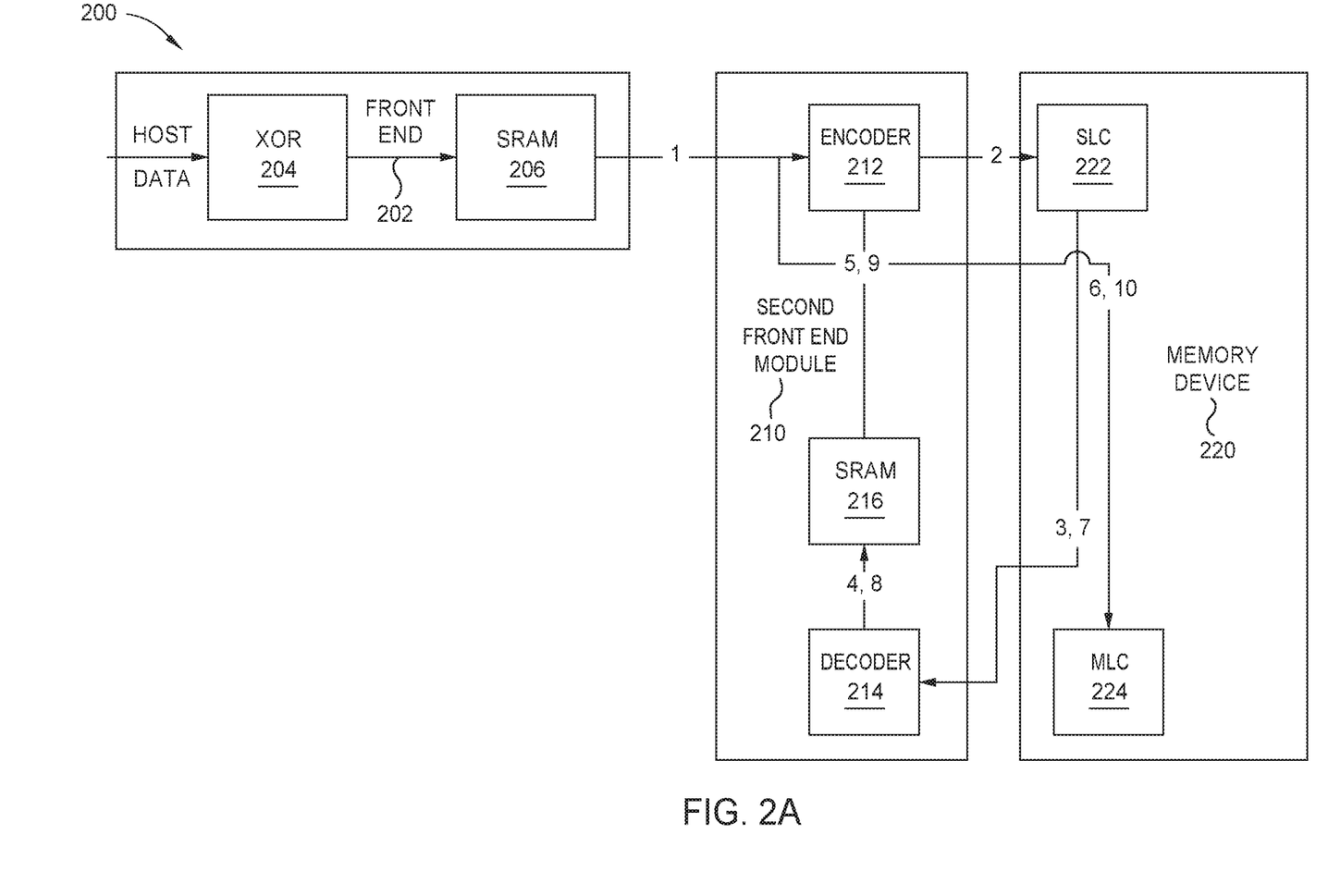
FIGS. 2A and 2B are schematic illustrations of scheduling foggy-fine programming according to various embodiments.
Figure 2B:
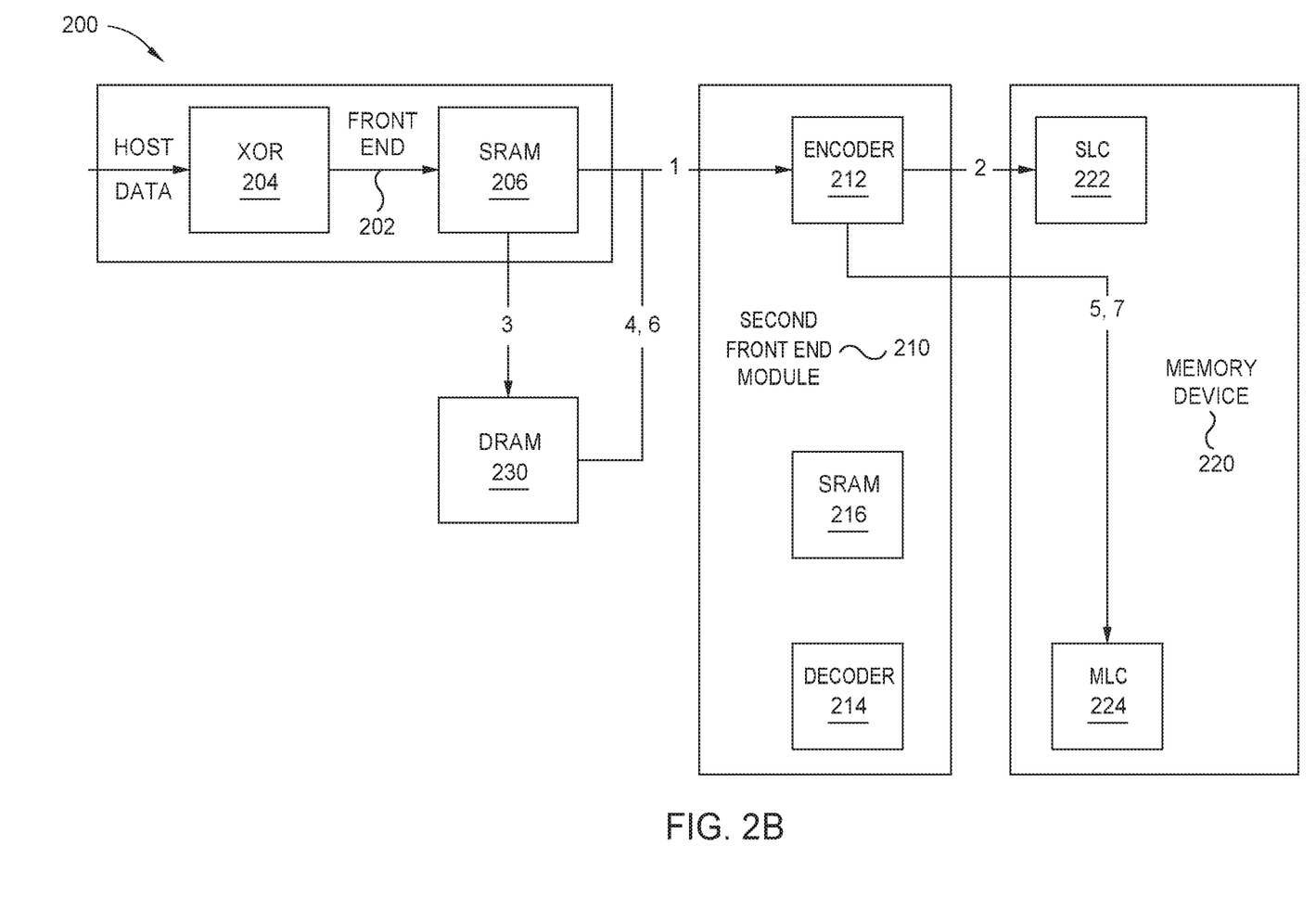

FIGS. 2A and 2B are schematic illustrations of scheduling foggy-fine programming according to various embodiments. The Front End (FE) module 202 comprises an XOR engine 204 and a static random-access memory (SRAM) 206. Host data may be initially delivered to the FE module 202. The data passes through the XOR engine 204 and is written to the SRAM 206. The XOR engine 204 generates XOR parity information prior to writing to SRAM 206. Exclusive OR (XOR) parity information is used to improve reliability of storage device for storing data, such as enabling data recovery of failed writes or failed reads of data to and from NVM or enabling data recovery in case of power loss. The storage device may be the data storage device 104 of FIG. 1. The reliability may be provided by using XOR parity information generated or computed based on data stored to storage device. The XOR engine 204 may generate a parity stream to be written to SRAM 206. SRAM 206 may contain a plurality of dies in which data may be written to.

The Second Flash Manager (FM2) module 210 comprises of an encoder 212, a SRAM 216, and a decoder 214. The decoder 214 may comprise a low gear (LG) decoder and a high gear (HG) decoder. The LG decoder can implement low power bit flipping algorithms, such as a low density parity check (LDPC) algorithm. The LG decoder may be operable to decode data and correct bit flips where such data has a low bit error rate (BER). The HG decoder can implement full power decoding and error correction algorithms, which may be initiated upon a failure of the LG decoder to decode and correct bit flips in data. The HG decoder can be operable to correct bit flips where such data has a high BER. Alternatively, FM2 may be replaced with a combined FE-FM monochip.

The encoder 212 and decoder 214 (including the LG decoder and HG decoder) can include processing circuitry or a processor (with a computer-readable medium that stores computer-readable program code (e.g., firmware) executable by the processor), logic circuitry, an application specific integrated circuit (ASIC), a programmable logic controller, an embedded microcontroller, a combination thereof, or the like, for example. In some examples, the encoder 212 and the decoder 214 are separate from the storage controller, and in other examples, the encoder 212 and the decoder 214 are embedded in or part of the storage controller. In some examples, the LG decoder is a hardened circuit, such as logic circuitry, an ASIC, or the like. In some examples, the HG decoder can be a soft decoder (e.g., implemented by a processor). Data may be written to SRAM 216 after being decoded at the decoder 214. The data at SRAM 216 may be further delivered to the encoder 212, as discussed below.

The memory device may be a NAND memory device. The memory device 220 may comprise of a SLC 222 and a MLC 224. It is to be understood that the embodiments discussed herein are applicable to any multilevel cell such as MLC, TLC or QLC. MLC is simply exemplified. SLC 222, MLC, TLC, QLC, and PLC are named according to the number of bits that a memory cell may accept. For example, SLC may accept one bit per memory cell and QLC may accept four bits per memory cell. Each bit is registered on the storage device as a 1 or a 0. Additionally, while SLC memory is exemplified as a memory device, it is also contemplated that the SLC memory may be replaced with a 2-bit cell or MLC memory device.

FIG. 2A is a schematic illustration of a foggy-fine writing process, according to one embodiment. Host data is fed to the FE module 202. The host data is sent through the XOR engine 204, and XOR parity information is generated. The data is then written to the SRAM 206 at the FE module 202. At the FM2 module 210, data is delivered to the encoder 212 from the SRAM 206 along stream 1. The data is then written to the SLC 222 of the memory device 220 along stream 2. To proceed with the foggy-fine writing to the MLC 224, the data is read from SLC 222 and then decoded at the decoder 214 of the FM2 module 210 along stream 3. The decoded data is then written to the SRAM 216 of the FM2 module 210 in steam 4. The data is then send through the encoded 212 along stream 5 for encoding. The foggy write occurs after the data that is encoded at the encoder 212 of the FM2 module 210 from the SRAM 216 of the FM2 module 210 along stream 6. The foggy write is the initial write from encoder 212 of the FM2 module 210 to the MLC 224 of the memory device 220. To proceed with the fine write, data is then read from SLC 222 and delivered to the decoder 214 along stream 7. Following decoding, the data is then written in SRAM along stream 8 and then delivered to the encoder 212 along stream 9 for encoding. The now encoded data is then fine written to MLC 224 along stream 10.

According to the embodiment referred to in FIG. 2A, there may be no DRAM-bus traffic. Furthermore, the SLC and MLC programming may be de-coupled. The foggy-fine writing process may incorporate multi-stream with direct write hot/cold sorting support. However, the bus traffic may be higher.

FIG. 2B is a schematic illustration of a foggy-fine writing process, according to another embodiment. Host data is delivered to the FE module 202. The host data passes through the XOR engine 204 and XOR parity information is generated. The data is then written to the SRAM 206 at the FE module 202. From the SRAM 206 at the FE module 202, the data is then transferred to the encoder 212 along stream 1. Once the data is encoded, the data is written to the SLC 222 along steam 2. Simultaneous with transferring the data to the encoder 212 along stream 1, the data is transferred to the DRAM 230 along stream 3. The foggy-fine writing process involves first sending the data written to the DRAM 230 and then to the encoder 212 along stream 4 for encoding. The encoded data is then foggy written to MLC along stream 5. Thereafter, the data is again sent from DRAM 230 to the encoder 212 along stream 6 for encoding. Following encoding, the data is then fine written along stream 7 to MLC 224. The foggy write step transfers the data from the DRAM 230 to the encoder 212 and writes the data to the MLC 224. The fine write step occurs after the foggy write step. The fine write step transfers the data from the DRAM 230 to the encoder 212 and writes the data to the MLC 224. The SLC and MLC programs may occur in a sequential write process due to buffer limitations.

Figure 3:
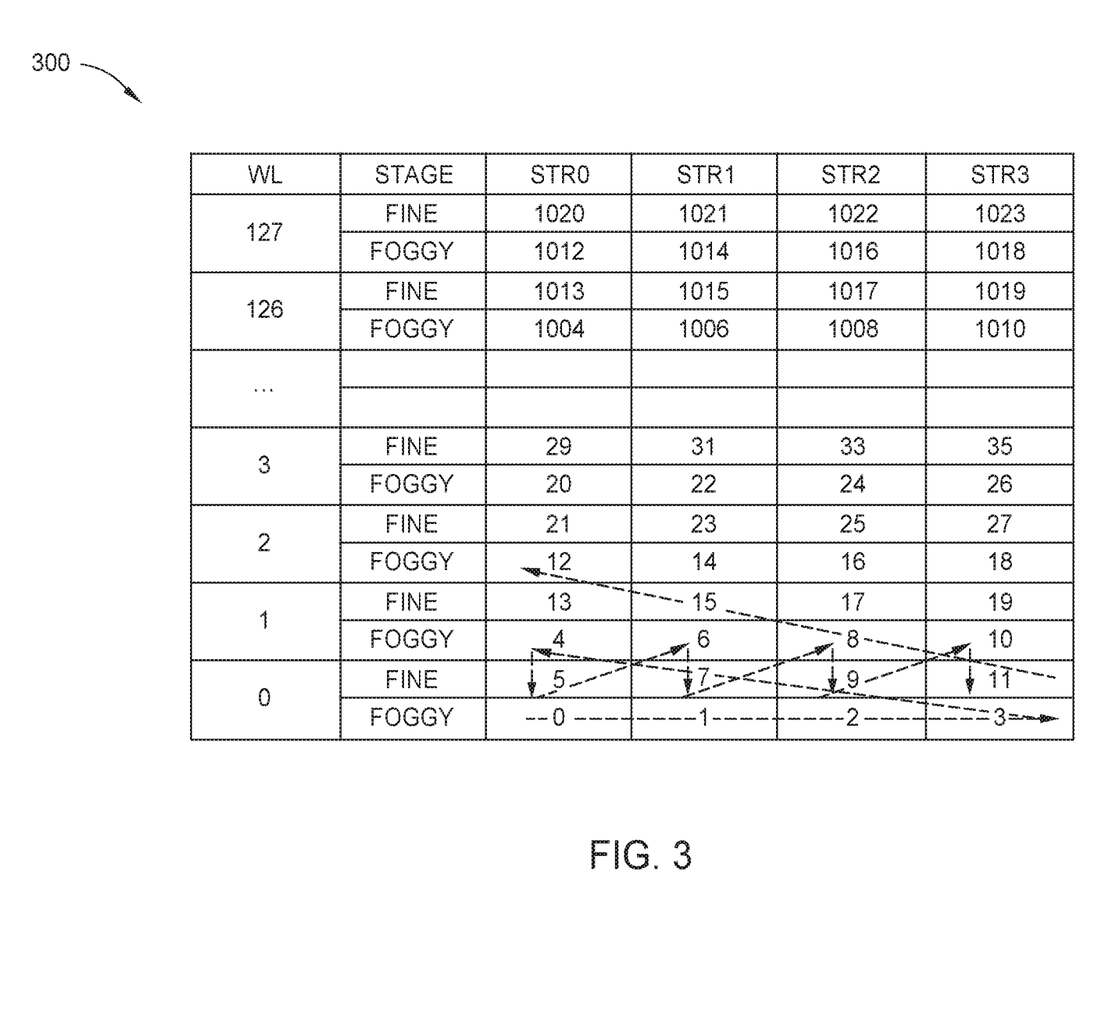
FIG. 3 is a chart illustrating staggering foggy-fine programming.

FIG. 3 is a chart illustrating staggering foggy-fine programming. It is to be understood that the disclosure is not limited to the staggered foggy-fine programming exemplified in FIG. 3, but rather, other sequences are contemplated as well. More specifically, to perform foggy-fine programming, foggy programming along a word line for a particular string cannot occur back-to-back. As shown in FIG. 3, to properly foggy-fine write to word line 0 at string 0, several additional writes need to occur between the foggy write to word line 0, string 0 and the fine write to word line 0, string 0. The foggy-fine write process proceeds as follows.

Initially, data is foggy written to word line 0, string 0. Then, data is foggy written to word line 0, string 1. Thereafter, data is foggy written to word line 0, string 2. Then, data is foggy written to word line 0, string 3. Thereafter, data is foggy written to word line 1, string 0. Now, finally, data can be fine written to word line 0, string 0. The arrows in FIG. 3 illustrate the path of writing in the foggy-fine writing process. Basically, to properly foggy-fine write data, data is initially foggy written to the specifically data location. Then, three additional foggy data writes occur to the same word line, but at different strings. A fifth foggy write occurs in an adjacent word line along the same string of the specific data location. Only after the fifth foggy write to the adjacent word line and same string may the fine writing to the original word line and original string (i.e., the original data location) be performed. In total, four additional foggy writes occur after the original foggy write on the word line at the original string prior to the fine writing at the original string on the word line.

Figure 4A:
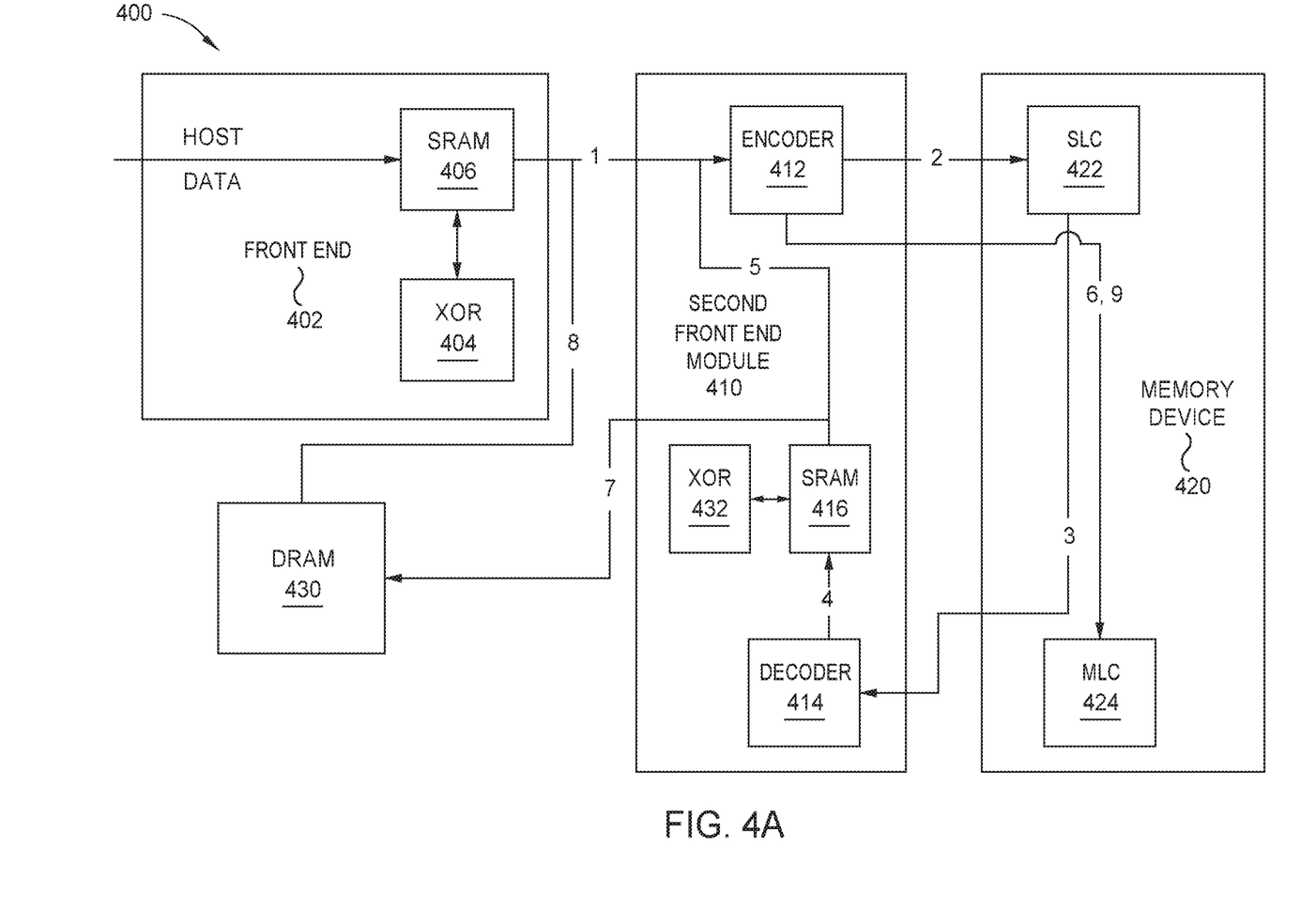
FIGS. 4A and 4B are schematic illustrations of scheduling foggy-fine programming and garbage collection according to one embodiment.

FIG. 4A is a schematic illustration of scheduling foggy-fine programming according to one embodiment. Aspects of FIGS. 2A and 2B may be similar to the embodiments described of the schematic illustrations of scheduling foggy-fine programming of FIG. 4A. Host data is written to the first SRAM 406 of the FE module 402. First XOR parity data may be generated, concurrently, at the first XOR engine 404 of the FE module 402 as the host data is written to the first SRAM 406. The host data and the generated first XOR parity data passes from the first SRAM 406 to the encoder 412 to be encoded along stream 1. The host data and the generated first XOR parity data is encoded and written to the SLC 422 of the memory device 420 along stream 2. The SLC 422 may be a region of the memory device 420 dedicated to protecting data in case of a power loss event. The programing to the SLC 422 and the programing to the MLC 424 are decoupled, which allows for increased scheduling flexibility and performance when compared to the embodiments described in FIG. 2B. The host data may further be sorted from the SLC 422 to multiple streams or erase blocks of the MLC 424.

At stream 3, the host data is read from the SLC 422 at the decoder 414. After the host data is decoded at the decoder 414, the host data is written to the second SRAM 416 of the FM2 410 along stream 4, where second XOR parity data is further generated for the host data at the second XOR engine 432 of the FM2 410. The host data and second XOR parity data are passed through the encoder 412 to be encoded along stream 5 and are foggy written to the MLC 424 along stream 6. During the foggy write, the controller may selectively choose data to read in order to allow for data sorting into the relevant one or more streams.

The host data and the generated second XOR parity data re further transferred along stream 7 from the second SRAM 416 to the DRAM 430. In one embodiment, stream 5 and stream 7 occur concurrently. In another embodiment, stream 5 occurs prior to stream 7. The DRAM 430 may be additional volatile memory of the storage device, such as the storage device 104 of FIG. 1. Furthermore, the DRAM 430 may stage (e.g., a temporary buffer) the host data and the second XOR parity data until the relevant wordline associated with the host data can be fine written. The host data and the second XOR parity data are further transferred from the DRAM 430 to the encoder 412 to be encoded along stream 8. After being encoded, the host data and the second XOR parity data are fine written to the MLC 424 along stream 9.

The total number of TM bus transfers or transfers from the FM2 410 to the memory device 420, or vice-versa, is about four. The total number of DRAM 430 bus transfers is about two. The total number of transfers from either the DRAM 430 or the FE module 402 to the FM2 410, or vice-versa, is about three, where about three transfers accounts for the host data transfers. The total number of transfers from either the DRAM 430 or the FE module 402 to the FM2 410, or vice-versa, may be more than about three depending on the number of transfers associated with the XOR parity data overhead.

Figure 4B:
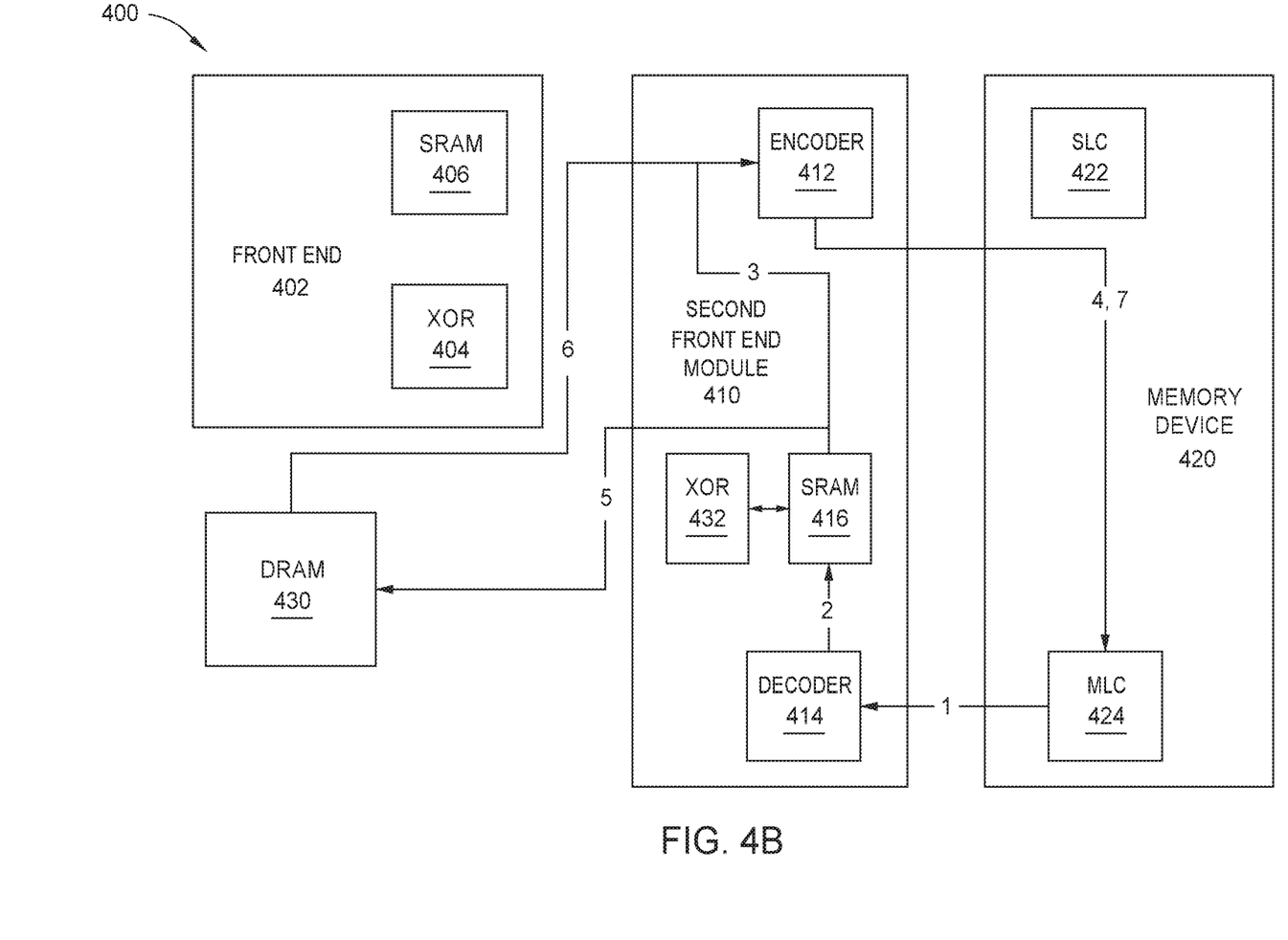

FIG. 4B is a schematic illustration of garbage collection according to one embodiment. Aspects of FIGS. 2A and 2B may be similar to the embodiments described of the schematic illustrations of garbage collection of FIG. 4B. Since the host data has already been committed to the NAND (e.g., the MLC 424) during the scheduling foggy-fine programming described in FIG. 4A, the host data does not need to be written from the SLC 422. Garbage collection is a process of memory management, where the controller, such as the controller 108 of FIG. 1, of the storage device, such as the storage device 104 of FIG. 1, attempts to deallocate memory locations that have outdated data in order to regain memory space. When garbage collection occurs, the controller may attempt to copy all relevant data (e.g., not outdated data) from a relevant location, such as a first erase block of a first stream, to another location, such as a second erase block of a first stream, in order to free the resources tied to the original location, the first erase block.

The host data from a first MLC 424 region (e.g., a first erase block of a first stream) is copied from the MLC 424 to the decoder 414 of the FM2 410 along stream 1. The host data is decoded and transferred to the second SRAM 416 along stream 2. Concurrently, second XOR parity data is generated at the second XOR engine 432. The host data and the second XOR parity data are transferred to the encoder 412 along stream 3, where the host data and the second XOR parity data are encoded. After encoding the host data and the second XOR parity data, the host data and the second XOR data are foggy written to the MLC 424 along stream 4.

The host data and the generated second XOR parity data are transferred along stream 5 from the second SRAM 416 to the DRAM 430. In one embodiment, stream 3 and stream 5 occur concurrently. In another embodiment, stream 3 occurs prior to stream 5. After being successfully written to the DRAM 430, the host data and the second XOR parity data are further transferred from the DRAM 430 to the encoder 412 along stream 6 to be encoded. The encoded host data and second XOR parity data are then fine written to the MLC 424 along stream 7. Garbage collection of the original location of the data may occur after any of the streams 1-7 have successfully completed. After garbage collection, the region in the MLC 424, where the host data and the second XOR parity data are stored, includes the relevant data and may require less memory space when compared to memory space requirement prior to garbage collection.

The total number of TM bus transfers or transfers from the FM2 410 to the memory device 420, or vice-versa, is about three. The total number of DRAM 430 bus transfers is about two. The total number of transfers from either the DRAM 430 or the FE module 402 to the FM2 410, or vice-versa, is about two, where about two transfers accounts for the host data transfers. The total number of transfers from either the DRAM 430 or the FE module 402 to the FM2 410, or vice-versa, may be more than about two depending on the number of transfers associated with the XOR parity data overhead. When comparing to the embodiment described in FIG. 2, the total number of TM bus transfers or transfers from the FM2 210 to the memory device 220, or vice-versa, is about three. The total number of DRAM 230 bus transfers is about three. The total number of transfers from either the DRAM 230 or the FE module 202 to the FM2 210, or vice-versa, is about three, where about three transfers accounts for the host data transfers. The total number of transfers from either the DRAM 230 or the FE module 202 to the FM2 210, or vice-versa, may be more than about three depending on the number of transfers associated with the XOR parity data overhead.

Figure 5:
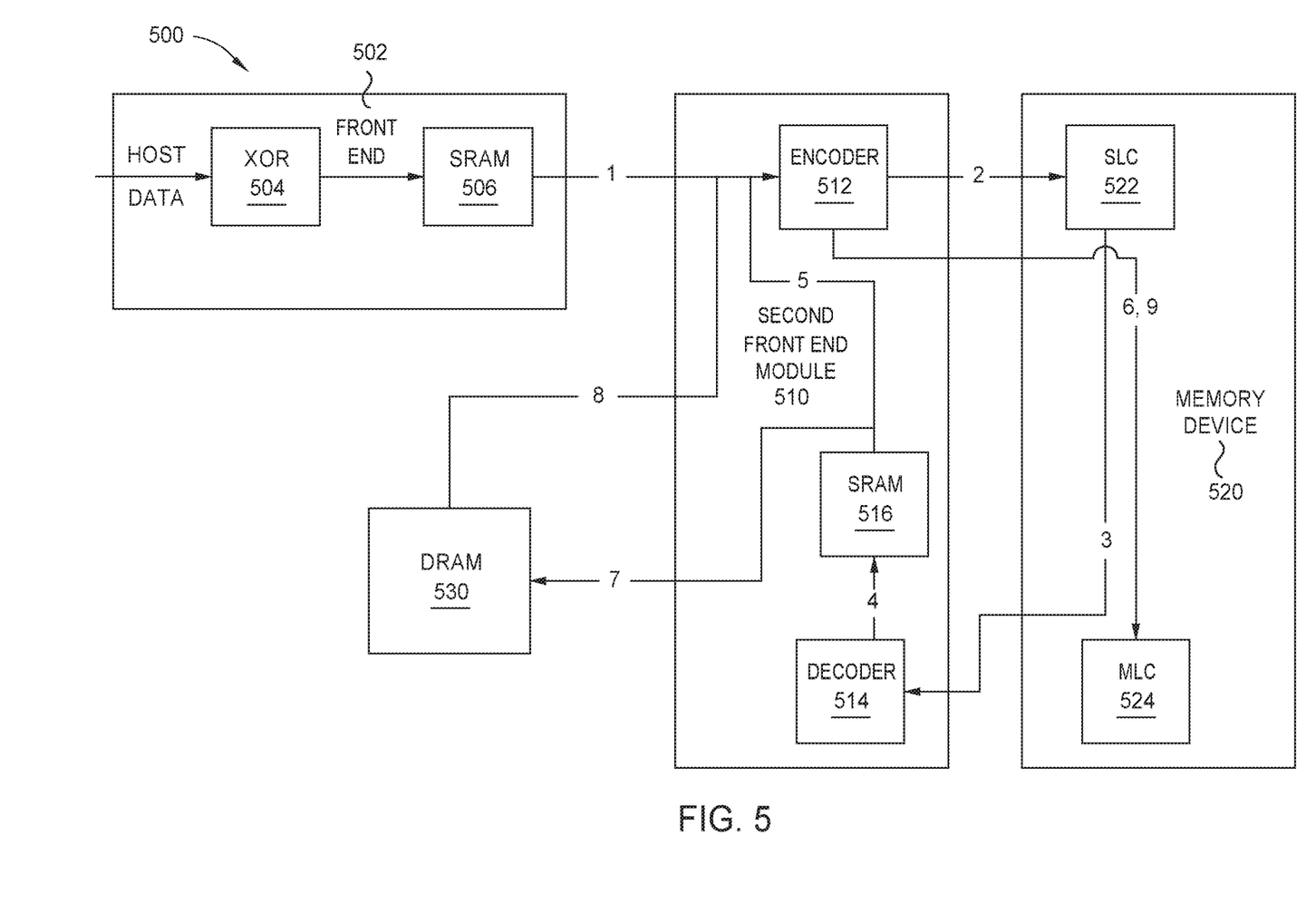
FIG. 5 is a schematic illustration of scheduling foggy-fine programming according to another embodiment.

FIG. 5 is a schematic illustration of scheduling foggy-fine programming according to another embodiment. Aspects of FIGS. 2A and 2B may be similar to the embodiments described of the schematic illustration of scheduling foggy-fine programming of FIG. 5. Host data is received by the FE module 502, where first XOR parity data is generated by the first XOR engine 504. The host data and the generated first XOR parity data are written to the first SRAM 506 of the FE module 502.

The host data and the first XOR parity data are transferred from the first SRAM 506 to the encoder 512 to be encoded along stream 1. The encoded host data and the encoded first XOR parity data are written to the SLC 522 along stream 2, where the SLC 522 may include a buffer to queue the data received before foggy-fine programming. The host data is transferred from the SLC 522 to the decoder 514 along stream 3, where the decoder 514 decodes the received host data. The decoded host data is written to the second SRAM 516 of the FM2 510 along stream 4. In one embodiment, XOR parity data is generated for the received decoded host data at the second SRAM 516. The host data is copied to the encoder 512 for encoding along stream 5, where the encoded host data is foggy written to the MLC 524 along stream 6.

The host data is transferred along stream 7 from the second SRAM 516 to the DRAM 530. In one embodiment, stream 5 and stream 7 occur concurrently. In another embodiment, stream 5 occurs prior to stream 7. After being successfully written to the DRAM 530, the host data and the second XOR parity data are further transferred from the DRAM 530 to the encoder 512 along stream 8 to be encoded. The encoded host data and second XOR parity data are then fine written to the MLC 524 along stream 9.

According to the embodiment referred to in FIG. 5, the SLC and MLC programming may be de-coupled. The foggy-fine writing process may incorporate multi-stream with direct write hot/cold sorting support as well as SLC burst support. Furthermore, open block reads from the SLC may be supported, where DR and RD open block issues are addressed. DRAM requirements may also be reduced compared to the previous embodiment described in FIGS. 2A and 2B.

The total number of TM bus transfers or transfers from the FM2 510 to the memory device 520, or vice-versa, is about four. The total number of DRAM 530 bus transfers is about two. The total number of transfers from either the DRAM 530 or the FE module 502 to the FM2 510, or vice-versa, is about three, where about three transfers accounts for the host data transfers. The total number of transfers from either the DRAM 530 or the FE module 502 to the FM2 510, or vice-versa, may be more than about three depending on the number of transfers associated with the XOR parity data overhead. When comparing to the embodiment described in FIG. 2, the total number of TM bus transfers or transfers from the FM2 210 to the memory device 220, or vice-versa, is about three. The total number of DRAM 230 bus transfers is about three. The total number of transfers from either the DRAM 230 or the FE module 202 to the FM2 210, or vice-versa, is about three, where about three transfers accounts for the host data transfers. The total number of transfers from either the DRAM 230 or the FE module 202 to the FM2 210, or vice-versa, may be more than about three depending on the number of transfers associated with the XOR parity data overhead.

Figure 6:
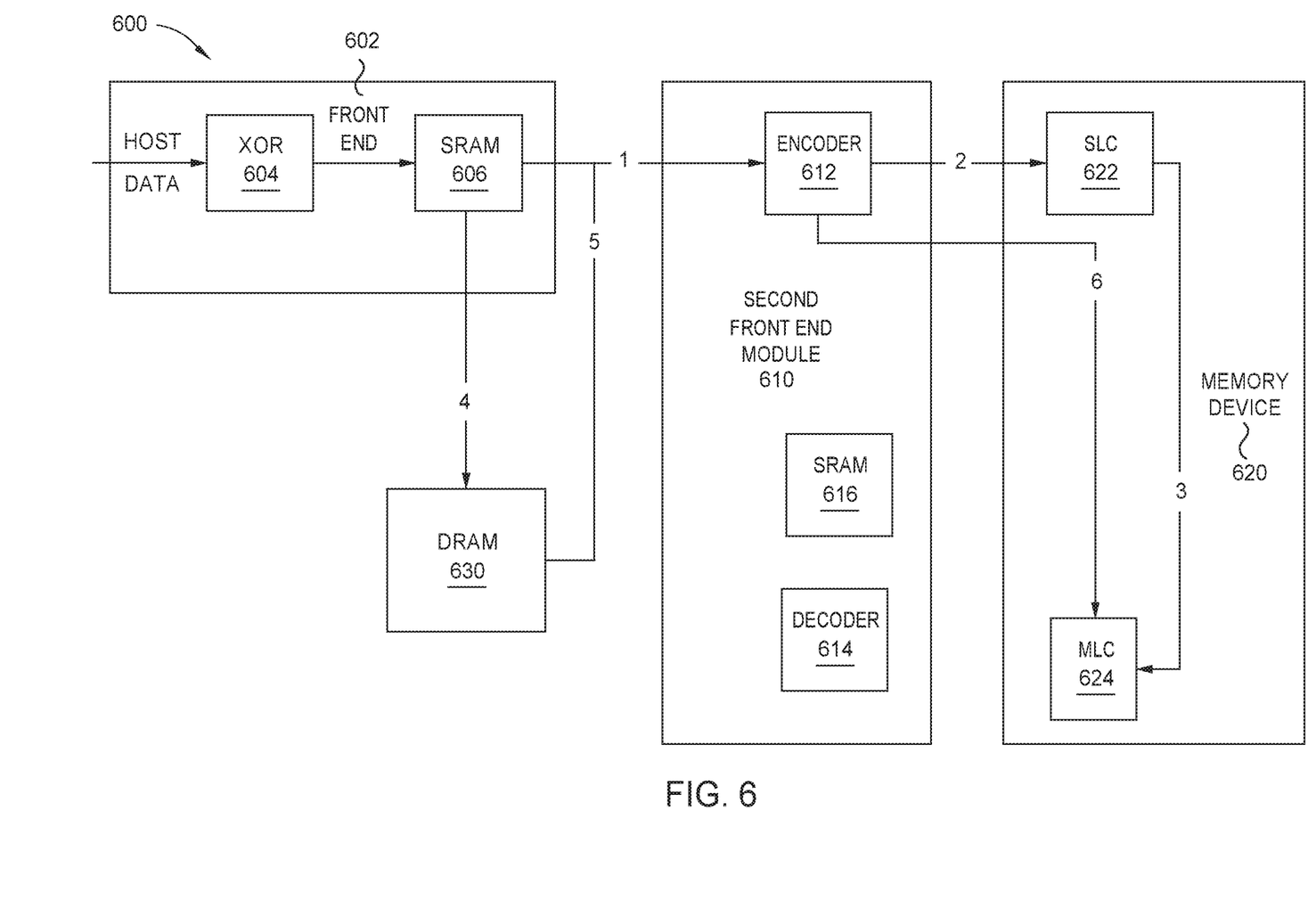
FIG. 6 is a schematic illustration of scheduling foggy-fine programming according to another embodiment.

FIG. 6 is a schematic illustration of scheduling foggy-fine programming according to another embodiment. Aspects of FIGS. 2A and 2B may be similar to the embodiments described of the schematic illustration of scheduling foggy-fine programming of FIG. 6. Host data is received by the FE module 602, where first XOR parity data is generated by the first XOR engine 604. The host data and the generated first XOR parity data are written to the first SRAM 606 of the FE module 602.

The host data and the first XOR parity data are transferred from the first SRAM 606 to the encoder 612 to be encoded along stream 1. The encoded host data and the encoded first XOR parity data are written to the SLC 622 along stream 2, where the SLC 622 may include a buffer to queue the data received before foggy-fine programming. The host data is foggy written to the MLC 624 from the SLC 622 along stream 3.

At the first SRAM 606, the host data and the first XOR parity data are written to the DRAM 630 along stream 4. The write to the DRAM 630 along stream 4 may occur concurrently with stream 1 or stream 2. The host data is copied from the DRAM 630 to the encoder 612 to be encoded along stream 5. The encoded host data is fine written to the MLC 624 along stream 6.

The total number of TM bus transfers or transfers from the FM2 610 to the memory device 620, or vice-versa, is about two, resulting in less TM bus power consumption than other previously described embodiments. The total number of DRAM 630 bus transfers is about two. The total number of transfers from either the DRAM 630 or the FE module 602 to the FM2 610, or vice-versa, is about two, where about two transfers accounts for the host data transfers. The total number of transfers from either the DRAM 630 or the FE module 602 to the FM2 610, or vice-versa, may be more than about two depending on the number of transfers associated with the XOR parity data overhead. When comparing to the embodiment described in FIG. 2, the total number of TM bus transfers or transfers from the FM2 210 to the memory device 220, or vice-versa, is about three. The total number of DRAM 230 bus transfers is about three. The total number of transfers from either the DRAM 230 or the FE module 202 to the FM2 210, or vice-versa, is about three, where about three transfers accounts for the host data transfers. The total number of transfers from either the DRAM 230 or the FE module 202 to the FM2 210, or vice-versa, may be more than about three depending on the number of transfers associated with the XOR parity data overhead.

Figure 7:
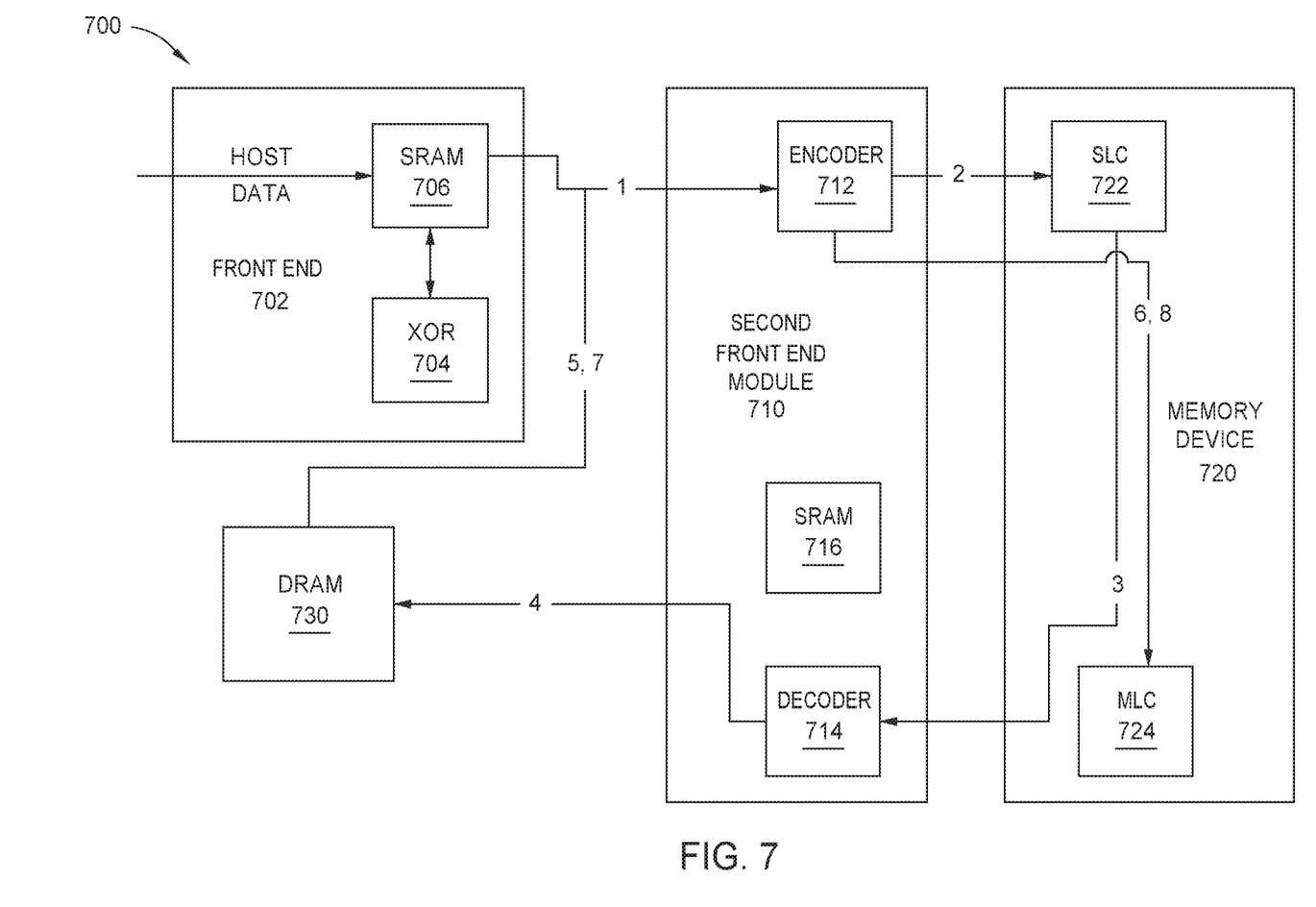
FIG. 7 is a schematic illustration of scheduling foggy-fine programming according to another embodiment.

FIG. 7 is a schematic illustration of scheduling foggy-fine programming according to another embodiment. Aspects of FIGS. 2A and 2B may be similar to the embodiments described of the schematic illustrations of scheduling foggy-fine programming of FIG. 7. Host data is received at the FE module 702, where the first XOR engine 704 generates first XOR parity data for the host data and both the host data and the first XOR parity data are written to the first SRAM 706. The host data and the first XOR parity data are copied from the SRAM 706 along stream 1 to the encoder 712. The encoder 712 encodes the received host data and first XOR parity data and writes the encoded data to the SLC 722 along stream 2.

The host data is transferred from the SLC 722 to the decoder 714 along stream 3, where the decoder 714 decodes the host data. The decoded host data is written to the DRAM 730 along stream 4. The host data is encoded at the encoder 712 along stream 5 and foggy written to the MLC 724 along stream 6. After the foggy write to the MLC 724, the host data is encoded again at the encoder 712 along stream 7, where the encoded host data is fine written to the MLC 724 along stream 8. The foggy-fine write to the MLC 724 does not include XOR parity data. The XOR parity data may be stored in the SLC 722.

The total number of TM bus transfers or transfers from the FM2 710 to the memory device 720, or vice-versa, is about four. The total number of DRAM 730 bus transfers is about three. The total number of transfers from either the DRAM 730 or the FE module 702 to the FM2 710, or vice-versa, is about four, where about four transfers accounts for the host data transfers. The total number of transfers from either the DRAM 730 or the FE module 702 to the FM2 710, or vice-versa, may be more than about four depending on the number of transfers associated with the XOR parity data overhead. When comparing to the embodiment described in FIG. 2, the total number of TM bus transfers or transfers from the FM2 210 to the memory device 220, or vice-versa, is about three. The total number of DRAM 230 bus transfers is about three. The total number of transfers from either the DRAM 230 or the FE module 202 to the FM2 210, or vice-versa, is about three, where about three transfers accounts for the host data transfers. The total number of transfers from either the DRAM 230 or the FE module 202 to the FM2 210, or vice-versa, may be more than about three depending on the number of transfers associated with the XOR parity data overhead.

Figure 8:
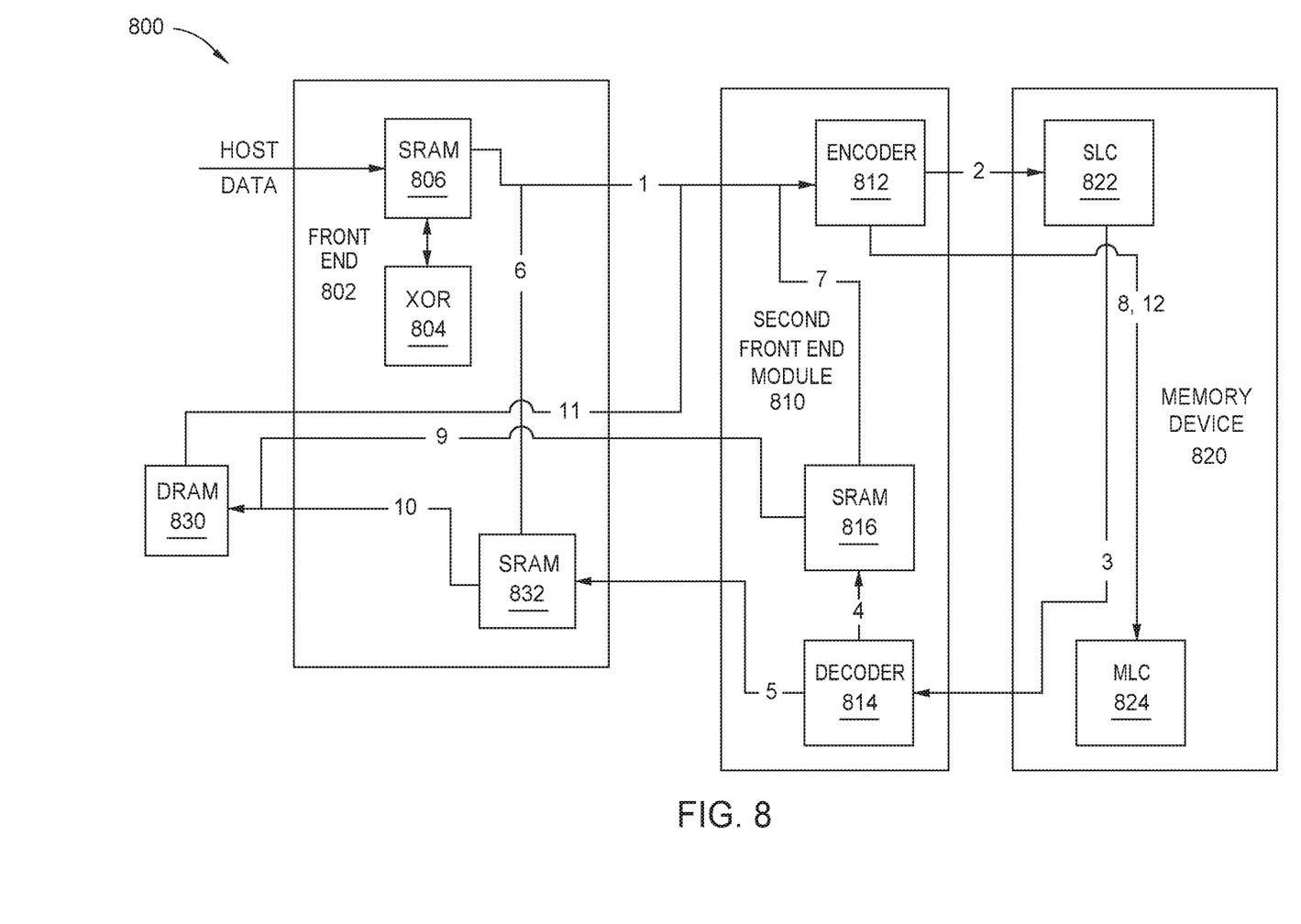
FIG. 8 is a schematic illustration of scheduling foggy-fine programming according to another embodiment.

FIG. 8 is a schematic illustration of scheduling foggy-fine programming according to another embodiment. Aspects of FIGS. 2A and 2B may be similar to the embodiments described of the schematic illustrations of scheduling foggy-fine programming of FIG. 8. Host data is received by the FE module 802 and written to the SRAM 806. The first XOR engine 804 generates first XOR parity data for the host data and writes the first XOR parity data to the SRAM 806. The host data and the first XOR parity data are transferred to the encoder 812 along stream 1, where the encoder 812 encodes the host data and the first XOR parity data.

The host data and the first XOR parity data are both written to the SLC 822 along stream 2. The host data is copied from the SLC 822 to the decoder 814 along stream 3, where the decoder 814 decodes the host data. The decoded host data is copied to the second SRAM 816 of the FM2 810 along stream 4 and to the third SRAM 832 of the FE module 802 along stream 5. The host data is copied from the third SRAM 832 to the encoder 812 along stream 6 and from the second SRAM 816 to the encoder 812 along stream 7.

The encoded host data is foggy written to the MLC 824 from the encoder 812 along stream 8. The decoded host data is copied from the second SRAM 816 to the DRAM 830 along stream 9 and from the third SRAM 832 to the DRAM 830 along stream 10. The host data is copied from the DRAM 830 to the encoder 812 along stream 11. The encoded host data is then fine written to the MLC 824 from the encoder 812 along stream 12. The foggy-fine write to the MLC 824 does not include XOR parity data. The XOR parity data may be stored in the SLC 822.

The total number of TM bus transfers or transfers from the FM2 810 to the memory device 820, or vice-versa, is about four. The total number of DRAM 830 bus transfers is about two. The total number of transfers from either the DRAM 830 or the FE module 802 to the FM2 810, or vice-versa, is about 3.5, where about 3.5 transfers accounts for a 50/50 SRAM buffer split. The total number of transfers from either the DRAM 830 or the FE module 802 to the FM2 810, or vice-versa, may be more than about 3.5 depending on the number of transfers associated with the XOR parity data overhead. When comparing to the embodiment described in FIG. 2, the total number of TM bus transfers or transfers from the FM2 210 to the memory device 220, or vice-versa, is about three. The total number of DRAM 230 bus transfers is about three. The total number of transfers from either the DRAM 230 or the FE module 202 to the FM2 210, or vice-versa, is about three, where about three transfers accounts for the host data transfers. The total number of transfers from either the DRAM 230 or the FE module 202 to the FM2 210, or vice-versa, may be more than about three depending on the number of transfers associated with the XOR parity data overhead.

In one embodiment, a data storage device comprises: one or more memory devices, the one or more memory devices including SLC memory and MLC memory; and a controller coupled to the one or more memory devices, the controller configured to: write data to the SLC memory; foggy write the data to MLC memory, wherein the foggy writing the data to the MLC memory includes: retrieving the data from latches in the one or more memory devices; decoding the data retrieved from the latches; encoding the decoded data retrieved from the latches; and writing the encoded data to the MLC memory; and fine writing the data to the MLC memory. The fine writing comprises: decoding the data retrieved from the latches; generating XOR data for the decoded data retrieved from the latches; transferring the decoded data retrieved from the latches and the generated XOR data to DRAM; encoding the transferred data; and writing the encoded data to the MLC memory. Decoding the data retrieved from latches for fine writing is the same decoding the data retrieved from latches for the foggy writing. The controller is configured to perform garbage collection, wherein the garbage collection comprises: reading data from MLC memory; decoding the read data; generating XOR data for the read data; encoding the generated XOR data and read data; and foggy writing the encoded data to the MLC memory. The garbage collection further comprises fine writing data to MLC memory, wherein the fine writing comprises: decoding the data read from MLC; generating XOR data for the read data; transferring the read data and the generated XOR data to DRAM; encoding the transferred data; and fine writing the encoded data to the MLC memory. Decoding the data retrieved from latches for fine writing is the same decoding the data retrieved from latches for the foggy writing. The foggy writing further comprises: generating XOR data for the decoded data retrieved from the latches; and transferring the generated XOR data to DRAM.

In another embodiment, a data storage device comprises: one or more memory devices, the one or more memory devices each including a plurality of dies with each die including SLC memory and MLC memory; and a controller coupled to the one or more memory devices, the controller configured to: write data to SLC memory; read data from SLC memory; decode the read data; transfer the decoded data to DRAM; encode the transfer data a first time; and write the first time encoded data to MLC memory a first time. The controller is further configured to encode the transfer data a second time. The controller is further configured to write the second time encoded data to the MLC memory. The writing the first time encoded data to MLC memory a first time is a foggy write. The writing the second time encoded data to MLC memory a second time is a fine write. The controller is further configured to transfer the decoded data to SRAM prior to transferring the decoded data to DRAM. The controller is further configured to encode some data transferred to SRAM without the data transferred to SRAM being transferred to DRAM.

In another embodiment, a data storage device comprises: one or more memory devices, wherein each memory device has a plurality of dies, wherein the one or more memory devices each include SLC memory and MLC memory; a controller coupled to the one or more memory devices, the controller configured to: write data to the SLC memory; read the data from the SLC memory; decode the read data; deliver the decoded data to a first SRAM located in a front end module; deliver the decoded data to a second SRAM located in a flash manager; write data delivered to the first SRAM in the MLC memory; and write data delivered to the second SRAM in the MLC memory. The controller is further configured to deliver decoded data to DRAM. The controller is further configured to encode the decoded data delivered to DRAM and write the encoded data to the MLC memory. The encoded data written to the MLC memory is finely written. The data written in the MLC memory from the first SRAM is foggy written. The data written in the MLC memory from the second SRAM is foggy written.

By reducing data transfers over a NAND bus and a DRAM bus, improved host write performance and reduced power occurs. The transfers over the NAND bus can be reduced by 20 percent and the transfers over the DRAM bus by ⅓.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
one or more memory devices, the one or more memory devices including SLC memory and MLC memory; and
a controller coupled to the one or more memory devices, the controller configured to:
 write data to the SLC memory;
 foggy write the data to MLC memory, wherein the foggy writing the data to the MLC memory includes:
  retrieving the data from the SLC memory;
  decoding the data retrieved from the SLC memory;
  encoding the decoded data retrieved from the SLC memory; and
  writing the encoded data to the MLC memory; and
 fine write the data to the MLC memory.

2. A data storage device, comprising:
one or more memory devices, the one or more memory devices including SLC memory and MLC memory; and
a controller coupled to the one or more memory devices, the controller configured to:
 write data to the SLC memory;
 foggy write the data to MLC memory, wherein the foggy writing the data to the MLC memory includes:
  retrieving the data from latches in the one or more memory devices;
  decoding the data retrieved from the latches;
  encoding the decoded data retrieved from the latches; and
  writing the encoded data to the MLC memory; and
 fine write the data to the MLC memory, wherein the fine writing comprises:
  decoding the data retrieved from the latches;
  generating XOR data for the decoded data retrieved from the latches;
  transferring the decoded data retrieved from the latches and the generated XOR data to DRAM;
  encoding the transferred data; and
  writing the encoded data to the MLC memory.

3. The data storage device of claim 2, wherein decoding the data retrieved from latches for fine writing is the same decoding the data retrieved from latches for the foggy writing.

4. A data storage device, comprising:
one or more memory devices, the one or more memory devices including SLC memory and MLC memory; and
a controller coupled to the one or more memory devices, the controller configured to:
 write data to the SLC memory;
 foggy write the data to MLC memory, wherein the foggy writing the data to the MLC memory includes:
  retrieving the data from latches in the one or more memory devices;
  decoding the data retrieved from the latches;
  encoding the decoded data retrieved from the latches; and
  writing the encoded data to the MLC memory;
 fine write the data to the MLC memory; and
 perform garbage collection, wherein the garbage collection comprises:
  reading data from MLC memory;
  decoding the read data;
  generating XOR data for the read data;
  encoding the generated XOR data and read data; and
  foggy writing the encoded data to the MLC memory.

5. The data storage device of claim 4, wherein the garbage collection further comprises fine writing data to MLC memory, wherein the fine writing comprises:
 decoding the data read from MLC;
 generating XOR data for the read data;
 transferring the read data and the generated XOR data to DRAM;
 encoding the transferred data; and
 fine writing the encoded data to the MLC memory.

6. The data storage device of claim 5, wherein decoding the data retrieved from latches for fine writing is the same decoding the data retrieved from latches for the foggy writing.

7. A data storage device, comprising:
one or more memory devices, the one or more memory devices including SLC memory and MLC memory; and
a controller coupled to the one or more memory devices, the controller configured to:
 write data to the SLC memory;
 foggy write the data to MLC memory, wherein the foggy writing the data to the MLC memory includes:
  retrieving the data from latches in the one or more memory devices;
  decoding the data retrieved from the latches;
  generating XOR data for the decoded data retrieved from the SLC memory;
  transferring the generated XOR data to DRAM;
  encoding the decoded data retrieved from the latches; and
  writing the encoded data to the MLC memory; and
 fine write the data to the MLC memory.

8. A data storage device, comprising:
one or more memory devices, the one or more memory devices each including a plurality of dies with each die including SLC memory and MLC memory; and
a controller coupled to the one or more memory devices, the controller configured to:
 write data to SLC memory;
 read data from SLC memory;
 decode the read data;
 transfer the decoded data to DRAM;
 encode the transfer data a first time; and
 write the first time encoded data to MLC memory a first time.

9. The data storage device of claim 8, wherein the controller is further configured to encode the transfer data a second time.

10. The data storage device of claim 9, wherein the controller is further configured to write the second time encoded data to the MLC memory.

11. The data storage device of claim 10, wherein the writing the first time encoded data to MLC memory a first time is a foggy write.

12. The data storage device of claim 11, wherein the writing the second time encoded data to MLC memory a second time is a fine write.

13. A data storage device, comprising:
one or more memory devices, the one or more memory devices each including a plurality of dies with each die including SLC memory and MLC memory; and
a controller coupled to the one or more memory devices, the controller configured to:
 write data to SLC memory;
 read data from SLC memory;
 decode the read data;
 transfer the decoded data to DRAM;

transfer the decoded data to SRAM prior to transferring the decoded data to DRAM;
encode the transfer data a first time; and
write the first time encoded data to MLC memory a first time.

14. The data storage device of claim 13, wherein the controller is further configured to encode some data transferred to SRAM without the data transferred to SRAM being transferred to DRAM.

15. A data storage device, comprising:
one or more memory devices, wherein the one or more memory devices each include SLC memory and MLC memory;
a controller coupled to the one or more memory devices, the controller configured to:
write data to the SLC memory;
read the data from the SLC memory;
decode the read data;
deliver the decoded data to a first SRAM located in a front end module;
deliver the decoded data to a second SRAM located in a flash manager;
write data delivered to the first SRAM in the MLC memory; and
write data delivered to the second SRAM in the MLC memory.

16. The data storage device of claim 15, wherein the controller is further configured to deliver decoded data to DRAM.

17. The data storage device of claim 16, wherein the controller is further configured to encode the decoded data delivered to DRAM and write the encoded data to the MLC memory.

18. The data storage device of claim 17, wherein the encoded data written to the MLC memory is finely written.

19. The data storage device of claim 15, wherein the data written in the MLC memory from the first SRAM is foggy written.

20. The data storage device of claim 15, wherein the data written in the MLC memory from the second SRAM is foggy written.

* * * * *